United States Patent
Anglin et al.

(10) Patent No.: US 11,646,213 B2
(45) Date of Patent: May 9, 2023

(54) MULTI-ZONE PLATEN TEMPERATURE CONTROL

(71) Applicant: Applied Materials, Inc., Santa Clara, CA (US)

(72) Inventors: Kevin R. Anglin, Beverly, MA (US); Simon Ruffell, Hamilton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 165 days.

(21) Appl. No.: 16/865,860

(22) Filed: May 4, 2020

(65) Prior Publication Data

US 2021/0343550 A1 Nov. 4, 2021

(51) Int. Cl.
*H01L 21/3065* (2006.01)
*H01L 21/673* (2006.01)
*H01L 21/02* (2006.01)
*H01L 21/67* (2006.01)

(52) U.S. Cl.
CPC ...... *H01L 21/673* (2013.01); *H01L 21/02694* (2013.01); *H01L 21/67248* (2013.01)

(58) Field of Classification Search
None
See application file for complete search history.

(56) References Cited

U.S. PATENT DOCUMENTS

| | | | |
|---|---|---|---|
| 6,570,171 B2 * | 5/2003 | Tomita | H01J 37/3171 250/398 |
| 8,449,679 B2 | 5/2013 | Dhindsa | |
| 10,109,510 B2 | 10/2018 | Anella et al. | |
| 10,199,246 B2 * | 2/2019 | Koizumi | F27B 5/18 |
| 10,665,433 B2 | 5/2020 | Likhanskii et al. | |

(Continued)

FOREIGN PATENT DOCUMENTS

| | | |
|---|---|---|
| CN | 101563751 A | 10/2009 |
| CN | 110268505 A | 9/2019 |

(Continued)

OTHER PUBLICATIONS

International Search Report and Written Opinion dated Jul. 28, 2021 in corresponding PCT application No. PCT/US2021/026991.

(Continued)

*Primary Examiner* — Ali Naraghi
(74) *Attorney, Agent, or Firm* — Nields, Lemack & Frame, LLC (57) ABSTRACT

A system and method for etching workpieces in a uniform manner are disclosed. The system includes a semiconductor processing system that generates a ribbon ion beam, and a workpiece holder that scans the workpiece through the ribbon ion beam. The workpiece holder includes a plurality of independently controlled thermal zones so that the temperature of different regions of the workpiece may be separately controlled. In certain embodiments, etch rate uniformity may be a function of distance from the center of the workpiece, also referred to as radial non-uniformity. Further, when the workpiece is scanned, there may also be etch rate uniformity issues in the translated direction, referred to as linear non-uniformity. The present workpiece holder comprises a plurality of independently controlled thermal zones to compensate for both radial and linear etch rate non-uniformity.

13 Claims, 10 Drawing Sheets

(56) References Cited

U.S. PATENT DOCUMENTS

| | | | |
|---|---|---|---|
| 2008/0042078 A1* | 2/2008 | England | H01J 37/20 |
| | | | 250/492.21 |
| 2008/0124903 A1 | 5/2008 | England et al. | |
| 2010/0330787 A1 | 12/2010 | Sferlazzo | |
| 2013/0206337 A1 | 8/2013 | Dhindsa et al. | |
| 2014/0047705 A1 | 2/2014 | Singh et al. | |
| 2014/0265853 A1 | 9/2014 | Radovanov et al. | |
| 2016/0111254 A1* | 4/2016 | Evans | H01J 37/32752 |
| | | | 427/523 |
| 2016/0217970 A1* | 7/2016 | Husain | H01L 21/265 |
| 2016/0225645 A1* | 8/2016 | Koizumi | H01L 21/67103 |
| 2017/0029950 A1 | 2/2017 | Chen et al. | |
| 2018/0211816 A1 | 7/2018 | Buonodono | |
| 2018/0294177 A1 | 10/2018 | Peng et al. | |
| 2019/0006587 A1 | 1/2019 | Gilchrist et al. | |
| 2019/0139774 A1 | 5/2019 | Biloiu et al. | |
| 2019/0198298 A1 | 6/2019 | Hirose et al. | |
| 2019/0272983 A1 | 9/2019 | Wallace et al. | |
| 2019/0304820 A1 | 10/2019 | Baggett et al. | |
| 2020/0090972 A1 | 3/2020 | Benjaminson et al. | |
| 2020/0243355 A1* | 7/2020 | Makabe | H01L 21/67109 |
| 2021/0272828 A1* | 9/2021 | Sundaram | C23C 16/46 |
| 2022/0246397 A1 | 8/2022 | Anglin et al. | |

FOREIGN PATENT DOCUMENTS

| | | |
|---|---|---|
| JP | 10-107134 A | 4/1998 |
| JP | 2007-67037 A | 3/2007 |
| TW | 201447954 A | 12/2014 |
| TW | 201523786 A | 6/2015 |
| TW | 201911410 A | 3/2019 |
| TW | 201943018 A | 11/2019 |
| TW | 201944451 A | 11/2019 |
| TW | 202017077 A | 5/2020 |
| TW | 202025217 A | 7/2020 |
| WO | 2009-058376 A2 | 5/2009 |

OTHER PUBLICATIONS

International Search Report and Written Opinion dated Jun. 7, 2022 in co-pending PCT application No. PCT/US2021/064636.
Office action dated Oct. 24, 2022 in co-pending U.S. Appl. No. 17/167,416.
Notice of Allowance dated Mar. 22, 2023 in co-pending U.S. Appl. No. 17/167,416.

* cited by examiner

MULTI-ZONE PLATEN TEMPERATURE CONTROL

FIELD

Embodiments of the present disclosure relate to systems and method for improving etch rate uniformity, and more particularly improving the etch rate uniformity of a workpiece scanned through a ribbon ion beam.

BACKGROUND

Ion beams may be used to implant dopants, etch material or amorphize workpieces, such as silicon substrates. These ion beams may be created using semiconductor processing system that includes an ion source that generates ions of a desired species. In certain embodiments, these ions are extracted and manipulated by a plurality of components that selects the desired species, and guide the ions toward the workpiece. In other embodiments, the ion source is located proximate to the workpiece and the ions are attracted from the ion source toward the workpiece.

In some implementations, the uniformity of various parameters may need to be tightly controlled. For example, in certain applications, it may be desired that the Width in Wafer (WiW) etch rate be within 3-5% (3 sigma value) or better. However, due to variation in beam current across its width and other phenomena, this may be difficult to achieve.

For example, for ribbon ion beams, it is typical for these ribbon beams to have non-uniform beam current in the X direction, especially at the ends of the ribbon beam.

Further, it is known that etch rates for many species is temperature dependent. As an example, etching oxide films with a $CF_4$-based chemistry may show that the etch rate has a direct relationship to the platen temperature. Etching nitride films with a $CH_3F$-based chemistry may show that the etch rate has an inverse relationship to the platen temperature. Maintaining a uniform workpiece temperature may be problematic, as the outer edge of the workpiece is typically somewhat cooler than the central portions of the workpiece. Additionally, the interface between the edge of the workpiece and the workpiece holder may affect the plasma sheath, the etchant concentration, or other parameters.

Therefore, it would be beneficial if there were a system and method for achieving the desired etch rate uniformity using a scanned ribbon ion beam. Further, it would be beneficial if the system was readily adaptable to different etching species.

SUMMARY

A system and method for etching workpieces in a uniform manner are disclosed. The system includes a semiconductor processing system that generates a ribbon ion beam, and a workpiece holder that scans the workpiece through the ribbon ion beam. The workpiece holder includes a plurality of independently controlled thermal zones so that the temperature of different regions of the workpiece may be separately controlled. In certain embodiments, etch rate uniformity may be a function of distance from the center of the workpiece, also referred to as radial non-uniformity. Further, when the workpiece is scanned, there may also be etch rate uniformity issues in the translated direction, referred to as linear non-uniformity. The present workpiece holder comprises a plurality of independently controlled thermal zones to compensate for both radial and linear etch rate non-uniformity.

According to one embodiment, a workpiece holder is disclosed. The workpiece holder comprises an inner thermal zone; and at least one concentric ring surrounding the inner thermal zone, wherein at least one of the at least one concentric ring is divided into a plurality of outer thermal zones. In certain embodiments, the inner thermal zone and the plurality of outer thermal zones may be independently controlled. In certain embodiments, a heating element is embedded in the inner thermal zone and each outer thermal zone. In some embodiments, the one of the at least one concentric ring is divided using radial spokes. In certain further embodiments, the plurality of outer thermal zones are equal sizes. In some embodiments, the one of the at least one concentric ring is divided using horizontal and vertical boundaries.

According to another embodiment, an etching system is disclosed. The etching system comprises a semiconductor processing system to generate a ribbon ion beam; a workpiece holder; and a scanning motor to move the workpiece holder through the ribbon ion beam, wherein the workpiece holder comprises a plurality of thermal zones to compensate for both radial and linear etch rate non-uniformities. In certain embodiments, the workpiece holder comprises an inner thermal zone; and at least one concentric ring surrounding the inner thermal zone, wherein at least one of the at least one concentric ring is divided into a plurality of outer thermal zones. In certain embodiments, the inner thermal zone and the plurality of outer thermal zones may be independently controlled. In certain embodiments, a heating element is embedded in the inner thermal zone and each outer thermal zone. In some embodiments, the one of the at least one concentric ring is divided using radial spokes. In certain further embodiments, the plurality of outer thermal zones are equal sizes. In some embodiments, the one of the at least one concentric ring is divided using horizontal and vertical boundaries. In some embodiments, the workpiece holder comprises a central thermal zone and one or more horizontal thermal zones disposed on opposite sides of the central thermal zone. In certain embodiments, the etching system comprises a thermal controller, comprising a plurality of power supplies in communication with the plurality of thermal zones and a controller in communication with the thermal controller, wherein a workpiece type and etching species are input to the controller and the thermal controller supplies power to the plurality of thermal zones to achieve a desired temperature profile.

According to another embodiment, an etching system is disclosed. The etching system comprises a semiconductor processing system to generate a ribbon ion beam; a workpiece holder; and a scanning motor to move the workpiece holder through the ribbon ion beam, wherein the workpiece holder comprises a plurality of thermal zones to compensate for linear etch rate non-uniformities. In certain embodiments, the workpiece holder comprises a central thermal zone, and one or more vertical thermal zones disposed on opposite sides of the central thermal zone. In some embodiments, the central thermal zone and the one or more vertical thermal zones may be independently controlled. In some embodiments, a heating element is embedded in the central thermal zone and each of the one or more vertical thermal zones. In certain embodiments, the etching system comprises a thermal controller, comprising a plurality of power supplies in communication with the plurality of thermal zones and a controller in communication with the thermal controller, wherein a workpiece type and etching species are input to the controller and the thermal controller supplies power to the plurality of thermal zones to achieve a desired temperature profile.

BRIEF DESCRIPTION OF THE FIGURES

For a better understanding of the present disclosure, reference is made to the accompanying drawings, which are incorporated herein by reference and in which.

DETAILED DESCRIPTION

As noted above, the present system may be used improve etch rate uniformity in systems that employ a workpiece that is scanned through a ribbon ion beam.

Figure 1:
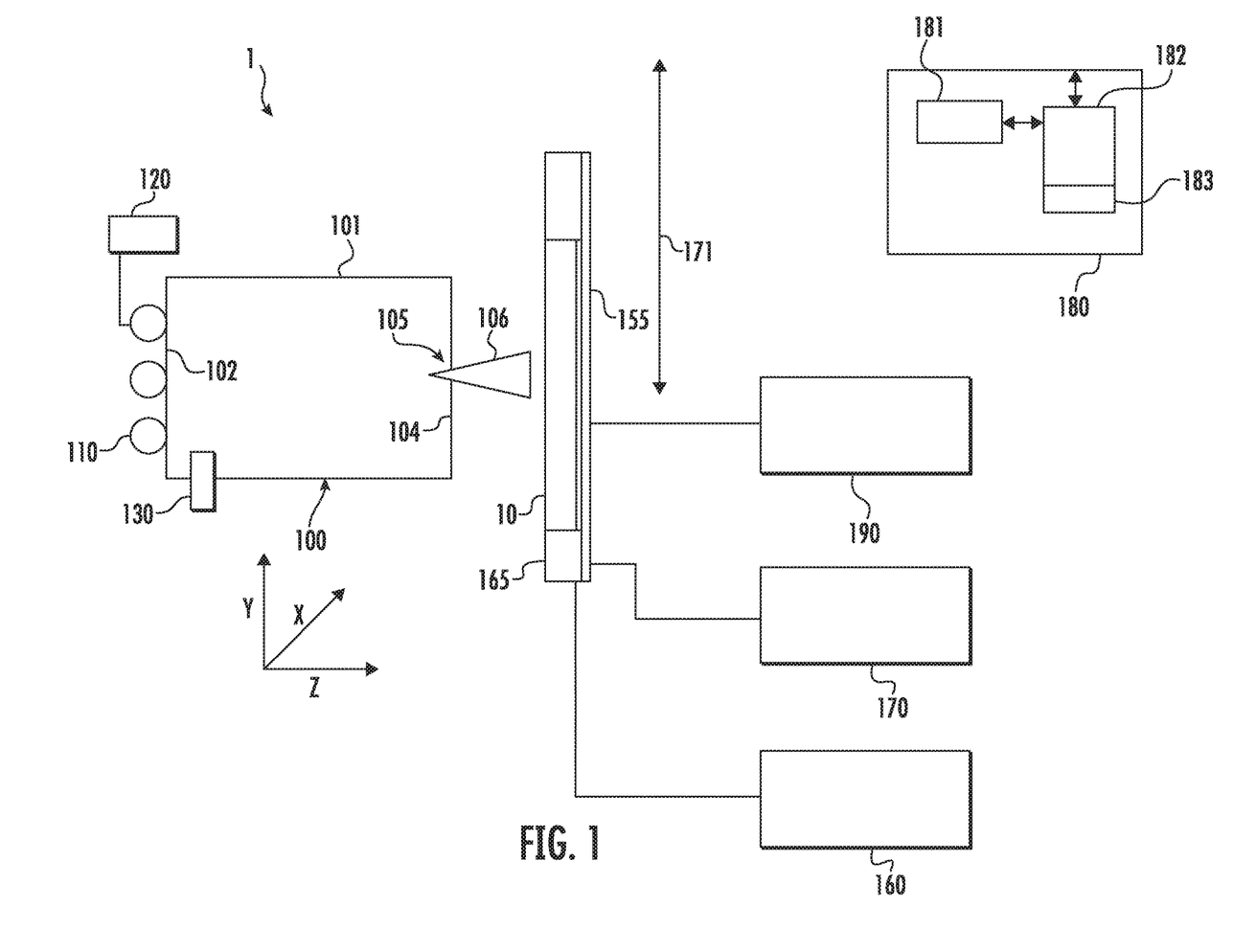
FIG. 1 is a semiconductor processing system in accordance with one embodiment.

The semiconductor processing system 1 comprises an ion source, which includes an ion source chamber 100, comprised of a plurality of chamber walls 101. In certain embodiments, one or more of these chamber walls 101 may be constructed of a dielectric material, such as quartz. An RF antenna 110 may be disposed on an exterior surface of a first dielectric wall 102. The RF antenna 110 may be powered by a RF power supply 120. The energy delivered to the RF antenna 110 is radiated within the ion source chamber 100 to ionize a feed gas, which is introduced via gas inlet 130.

One chamber wall, referred to as the extraction plate 104 includes an extraction aperture 105 through which an ion beam 106 may exit the ion source chamber 100. The ion beam 106 may be much wider in the horizontal direction, also referred to as the X direction, than the height direction. An ion beam having these characteristics may be referred to as a ribbon ion beam. The extraction plate 104 may be constructed of an electrically conductive material, such as titanium, tantalum or another metal. The extraction plate 104 may be in excess of 300 millimeters in width. Further, the extraction aperture 105 may be wider in the X direction than the diameter of the workpiece 10. This extraction plate 104 may be biased at an extraction voltage. In other embodiments, the extraction plate 104 may be grounded.

In addition to the semiconductor processing system 1, there is a workpiece holder 155. The workpiece holder 155 may be disposed proximate the extraction aperture 105. A workpiece 10 may be disposed on the workpiece holder 155. The workpiece holder 155 is scanned using a scan motor 160, which moves in the vertical direction 171. This direction is also referred to as the Y direction. Thus, the workpiece holder 155 is configured so that there is relative vertical movement between the ion beam 106 and the workpiece holder 155.

Surrounding the workpiece 10 is a shield 165, which may also be referred to as a halo. The shield 165 surrounds the workpiece 10 and has an opening in its center, which corresponds to the location of the workpiece 10. The shield 165 may be constructed of an electrically conductive material, such as a metal. The shield 165 may be made of titanium, silicon, silicon carbide or another material. The shield 165 may be considered to be part of the workpiece holder 155.

The shield 165 and workpiece holder 155 may be biased using a workpiece bias power supply 170. In certain embodiments, the output from the workpiece bias power supply 170 is a pulsed DC voltage, having a frequency of between 5 kHz and 50 kHz and an amplitude of 100 to 5,000 volts.

While the above disclosure describes the output from the workpiece bias power supply 170 as being a pulsed DC voltage, it is understood that the workpiece bias power supply 170 may be constant, while an extraction voltage power supply, which biases the extraction plate 104, provides a pulsed DC output.

When pulsed, the voltage applied to the workpiece holder 155 and the shield 165 is more negative than the voltage applied to the extraction plate 104. In other words, if the extraction plate 104 is grounded, the workpiece bias power supply 170 generates negative pulses. During these negative pulses, positive ions are attracted from the interior of the ion source chamber 100 to the workpiece 10. If the extraction plate 104 is positively biased, the workpiece bias power supply 170 generates less positive or negative pulses, such that positive ions are attracted from the interior of the ion source chamber 100 to the workpiece 10 during these pulses.

A thermal controller 190 may also be in communication with the workpiece holder 155. The thermal controller may comprise a plurality of power supplies, which supply a voltage or current to each of the plurality of thermal zones in the workpiece holder 155, as described in more detail below.

A controller 180 may be in communication with the workpiece bias power supply 170, the workpiece holder 155, the thermal controller 190 and other components. The controller 180 may include a processing unit 181, such as a microcontroller, a personal computer, a special purpose controller, or another suitable processing unit. The controller 180 may also include a non-transitory storage element 182, such as a semiconductor memory, a magnetic memory, or another suitable memory. This non-transitory storage element 182 may contain instructions 183 and other data that allows the controller 180 to perform the functions described herein. The controller 180 may be capable of controlling the movement of the workpiece holder 155 and controlling the temperature of the workpiece holder 155 via scan motor 160 and thermal controller 190, respectively.

Figure 2:
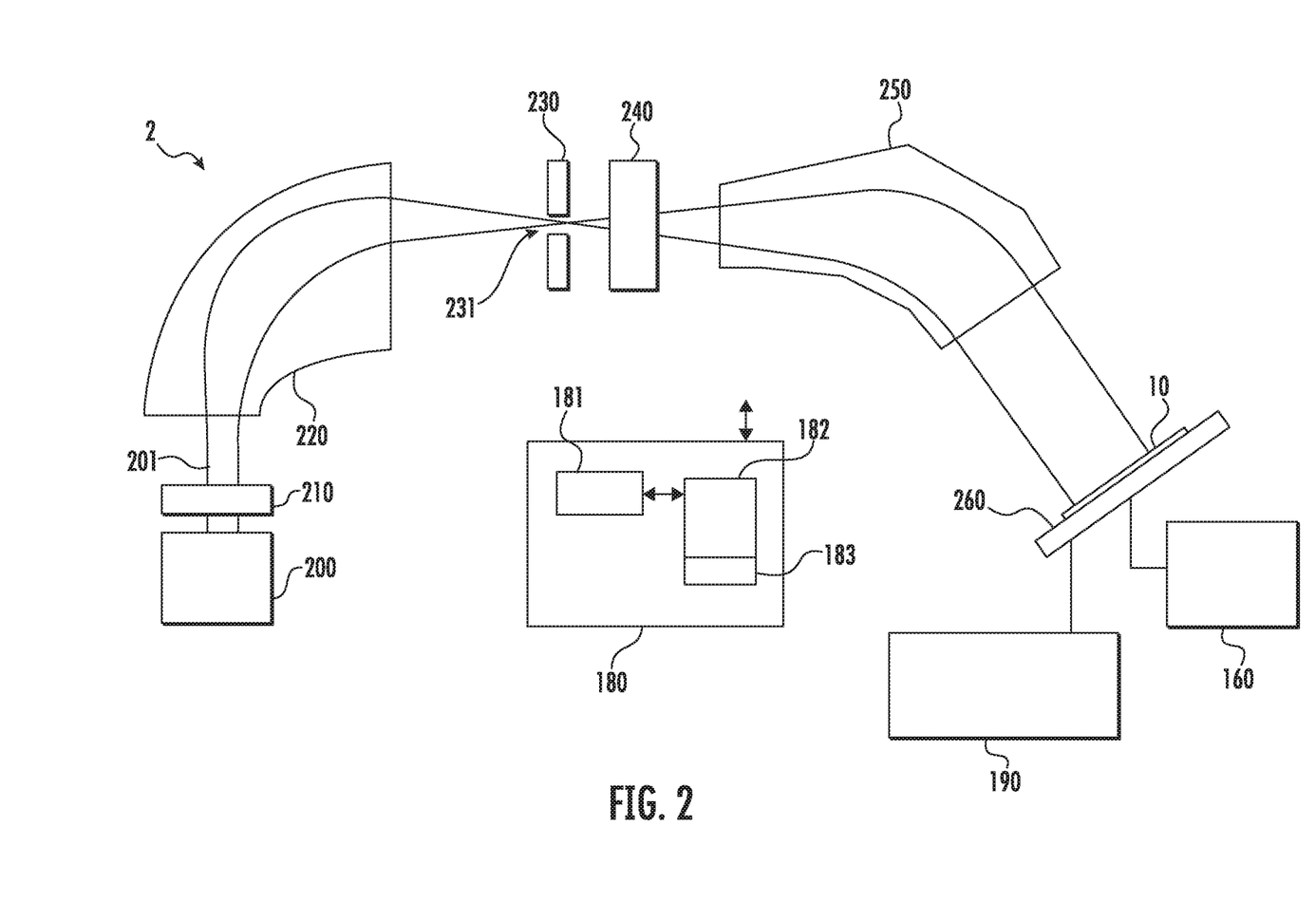
FIG. 2 is a semiconductor processing system in accordance with a second embodiment.

Of course, other configurations may also be employed. For example, FIG. 2 shows a different type of semiconductor processing system 2 that includes an ion source 200 comprising a plurality of chamber walls defining an ion source chamber in which a plasma is created. In certain embodiments, the ion source 200 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 201 generated in the ion source chamber are extracted and directed through a mass analyzer and toward a workpiece 10. The extraction aperture may be any suitable shape. In certain embodiments, the extraction aperture may be oval or rectangular shaped, having one dimension, referred to as the width (x-dimension), which may be much larger than the second dimension, referred to as the height (y-dimension).

Disposed outside and proximate the extraction aperture of the ion source 200 are extraction optics 210. In certain embodiments, the extraction optics 210 comprises one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source so as to attract ions through the extraction aperture. The extraction aperture and the aperture in the extraction optics are aligned such that the ions 201 pass through both apertures.

Located downstream from the extraction optics 210 is a mass analyzer 220. The mass analyzer 220 uses magnetic fields to guide the path of the extracted ions 201. The magnetic fields affect the flight path of ions according to their mass and charge. A mass resolving device 230 that has a resolving aperture 231 is disposed at the output, or distal end, of the mass analyzer 220. By proper selection of the magnetic fields, only those ions 201 that have a selected mass and charge will be directed through the resolving aperture 231. Other ions will strike the mass resolving device 230 or a wall of the mass analyzer 220 and will not travel any further in the system.

In certain embodiments, the ions that pass through the mass analyzer 220 may form a spot beam.

The spot beam may then enter a scanner 240 which is disposed downstream from the mass resolving device 230. The scanner 240 causes the spot beam to be fanned out into a plurality of divergent beamlets. The scanner 240 may be electrostatic or magnetic.

In other embodiments, the ions that pass through the mass analyzer 220 may form a ribbon ion beam, where a wide beam is transported throughout the semiconductor processing system. For example, a ribbon beam may be extracted from the ion source 200. In this embodiment, the scanner 240 is not needed.

In certain embodiments, a collimator magnet 250 then converts these divergent beamlets into a plurality of parallel beamlets that are directed toward the workpiece 10.

The output from this semiconductor processing system is a ribbon ion beam that is directed toward the workpiece 10.

The workpiece 10 is disposed on a movable workpiece holder 260 disposed downstream from the collimator magnet 250. The workpiece holder 260 is scanned using a scan motor 160, which moves in the direction perpendicular to the longer dimension of the ribbon ion beam.

In certain embodiments, the direction of the ion beam is referred to as the Z-direction, the direction perpendicular to this direction and horizontal may be referred to as the X-direction, while the direction perpendicular to the Z-direction and vertical may be referred to as the Y-direction. In this example, it is assumed that the wider dimension of the ribbon ion beam is the X-direction while the movable workpiece holder 260 is translated by the scan motor 160 in the Y-direction.

A thermal controller 190 may also be in communication with the workpiece holder 260. The thermal controller 190 may comprise a plurality of power supplies, which provide a voltage or current to each of the plurality of thermal zones in the workpiece holder 260, as described in more detail below.

A controller 180, such as that described above, may be used to control the system. The actual implementation of the controller 180 is not limited by this disclosure.

The controller 180 may be in communication with the movable workpiece holder 260, the thermal controller 190 and other components as described in more detail below.

Thus, there are various semiconductor processing systems that may utilize the movable workpiece holder described herein.

As noted above, there may be two types of etch rate non-uniformity. The first, referred to as radial non-uniformity, is the result of discontinuities at the edge of the workpiece. These discontinuities may be chemical, thermal or electrical. For example, as described with respect to FIG. 1, there may be a shield around the workpiece 10. If the material used to construct the shield is more resistant to chemical etching than the workpiece, there may be a surplus of etching species available at this interface that can lead to faster etching of the outer edge of the workpiece. Conversely, if the material used to construct the shield is less resistant to chemical etching than the workpiece, the shield may serve as a sink and there may be a deficit of etching species available at this interface that can lead to slower etching of the outer edge of the workpiece. If the dielectric constant of the shield is different from the workpiece, there may be a distortion of the electrical fields at the edge of the workpiece. This distortion may attract or repel ions from the edge of the workpiece 10 as the extraction bias is pulsed. Additionally, if the shield is colder than the workpiece, it may collect deposition at a faster rate from polymerizing gas chemistries, which may also affect the etch rate at the edge of the workpiece.

The second type of non-uniformity is referred to linear non-uniformity. As stated above, the workpiece 10 is scanned in the Y direction through a ribbon ion beam. Often, the beam current profile of the ribbon ion beam in the X direction is not constant. Rather, often, the current profiles near the ends of the ribbon ion beam may be lower or greater than the current profile near the center of the ribbon ion beam.

FIG. 3A-3E shows etch rate maps for five different combinations of etching species and workpiece type. These etch rate maps are created by measuring a thickness of the workpiece at a plurality of locations prior to the etching operation and measuring the thickness of those same locations after the etching operation. Regions 280 are etched to a greater extent than the other regions. Regions 282 are etched to a lesser extent than the other regions. Regions 281 are those areas where the etch rate lies between these two extremes.

Figure 3A:
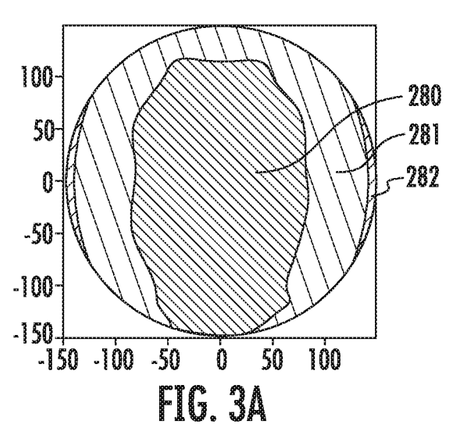
FIG. 3A-3E show the etch rate maps for various etching species and workpiece types.
Figure 3B:
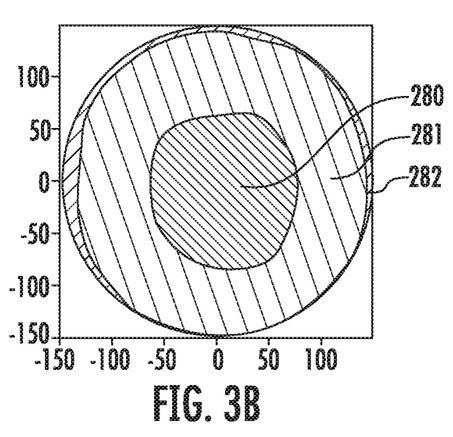
Figure 3C:
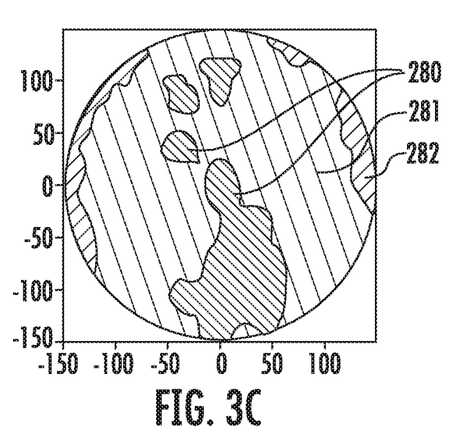
Figure 3D:
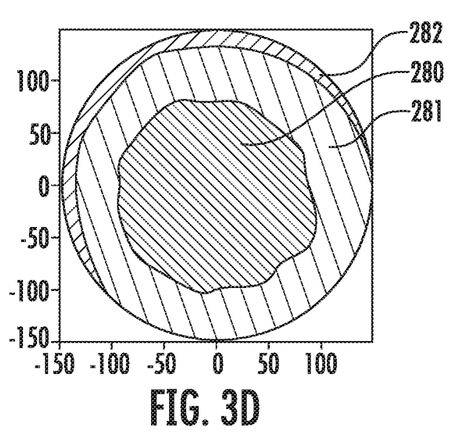
Figure 3E:
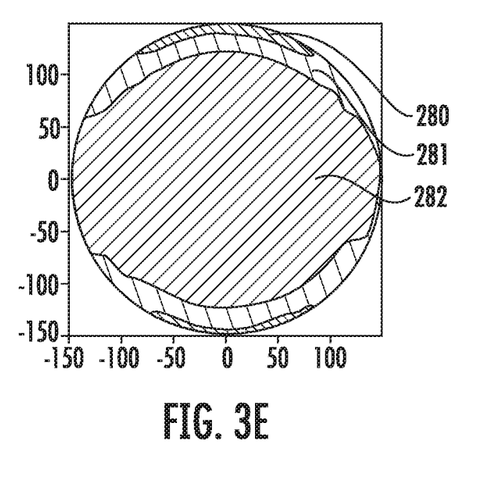

Note that each of these etch rate maps displays radial non-uniformity, linear non-uniformity, or a superposition of the two types of non-uniformity. Specifically, FIGS. 3A and 3C show predominantly linear non-uniformity. FIGS. 3B and 3D shows predominantly radial non-uniformity. FIG. 3E shows both types of non-uniformity. Specifically, in FIG. 3E, there is radial non-uniformity that causes the outer edge to be etched more than the center of the workpiece. Additionally, there is linear non-uniformity that causes the ends of the ribbon ion beam to etch less than the center of the ion beam. When these two non-uniformities are combined, only the top and bottom edges of the workpiece are etched more than the rest of the workpiece.

Figure 4:
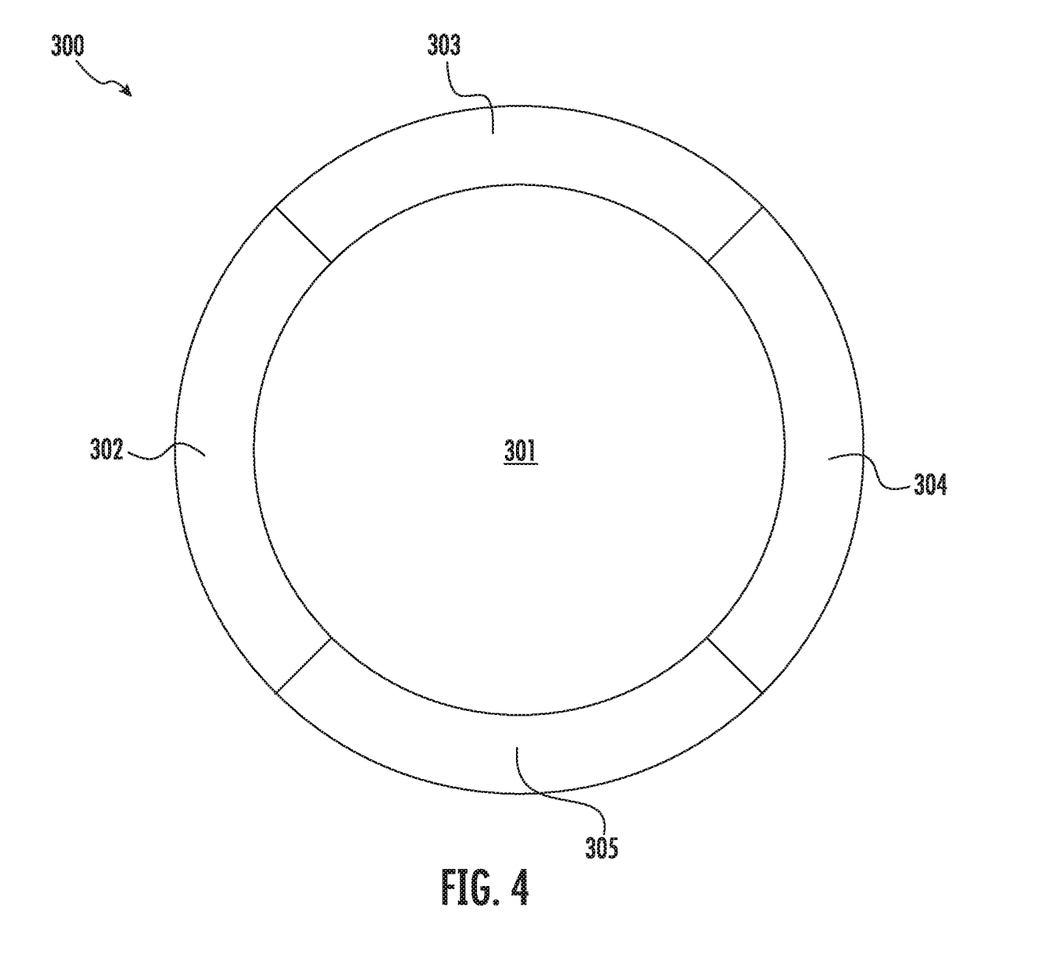
FIG. 4 is a first embodiment of a multi-zone heated workpiece holder.

FIG. 4 shows a front view of a workpiece holder 300 that may be used to compensate for radial and/or linear non-uniformity according to one embodiment. The workpiece holder 300 comprises a plurality of independently controlled thermal zones. A thermal zone is defined as an area of the workpiece holder that is independently controlled and maintained at a selected temperature.

In FIGS. 3A-3E, the five thermal zones are defined. The inner thermal zone 301 is a circular area with its center corresponding to the center of the workpiece. The radius of the inner thermal zone 301 is less than the radius of the workpiece. A concentric ring extends beyond the inner thermal zone 301 in the radial direction. This concentric ring may be divided into two or more thermal zones. For example, FIG. 4 shows the concentric ring divided into four outer thermal zones 302-305. In certain embodiments, each of the outer thermal zones is equally sized. For example, the boundaries between the outer thermal zones in FIG. 4 are at 45°, 135°, 225° and 315°. However, other sizes are also possible. For example, the two outer thermal zones 302, 304 may be larger or smaller than the other two outer thermal zones 303, 305. For example, if the two outer thermal zones 302, 304 are to be larger than the other two outer thermal zones, the boundaries between the outer thermal zones may be at 60°, 120°, 240° and 300°. Similarly, if the two outer thermal zones 302, 304 are to be smaller than the other two outer thermal zones, the boundaries between the outer thermal zones may be at 30°, 150°, 210° and 330°.

In certain embodiments, each of these outer thermal zones 302-305 may be independently controlled. In other embodiments, two or more outer thermal zones may be commonly controlled. For example, the two outer thermal zones 302, 304, which correspond to the locations where the ends of the ribbon ion beam strike the workpiece, may be commonly controlled. Similarly, the other two outer thermal zones 303, 305 may be commonly controlled.

These thermal zones may be implemented in a number of ways. In one embodiment, one or more heating elements are embedded in each thermal zone. All heating elements in a particular thermal zone may be commonly controlled. For example, all of the heating elements in one thermal zone may be supplied the same current or voltage by the thermal controller 190. In operation, power, provided by thermal controller 190, is supplied through electrical wires to the heating elements, which convert the electrical energy to heat. A temperature sensor may be disposed in each thermal zone to measure the actual temperature and provide feedback to the thermal controller 190. In this way, each thermal zone may be maintained at its desired temperature.

Thus, in one embodiment, the controller 180 receives information about the etching species being used as well as the type of workpiece. This information may be entered via an input device, such as a keyboard or touchscreen. Based on this information, the controller 180 instructs the thermal controller 190 of the desired temperature of each of the thermal zones in the workpiece holder 300. The thermal controller 190 then supplies the power to each thermal zone to achieve the desired temperature profile.

For example, FIGS. 5A-5E show the etch rate maps of FIGS. 3A-3E, respectively, and the corresponding temperature profile for each. Note that in FIGS. 5A and 5C, the etch rate along the left and right edges is less than other locations on the workpiece. Thus, in this situation, the outer thermal zones 302, 304 are set to a different temperature than the other thermal zones. For many workpieces and etching species, etch rate is directly proportional to temperature. Thus, to increase the etch rate along the left and right edges of the workpiece, the outer thermal zones 302, 304 are set to a higher temperature than the other thermal zones. Of course, it is possible for some etch chemistries that etch rate has an inverse relationship with temperature. In this case, to increase the etch rate along the left and right edges of the workpiece, the outer thermal zones 302, 304 are set to a lower temperature than the other thermal zones.

Figure 5A:
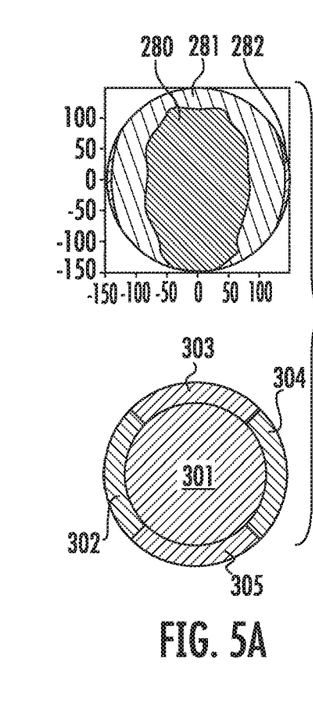
FIG. 5A-5E illustrate the heating patterns for the workpiece holder of FIG. 4 for the various etch rate maps.
Figure 5B:
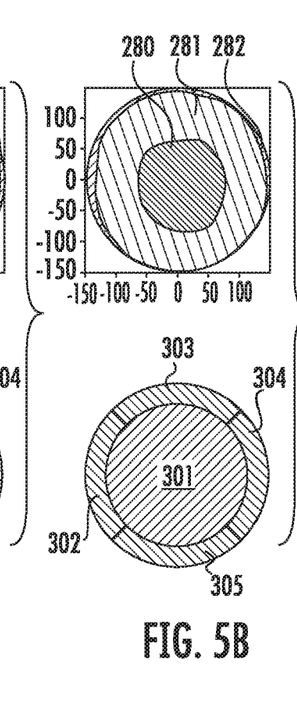
Figure 5C:
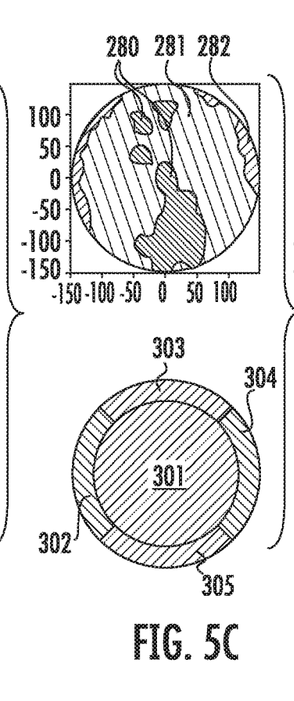
Figure 5D:
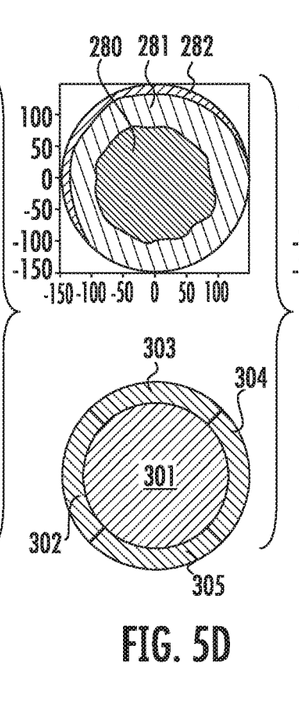

FIGS. 5B and 5D show a radial non-uniformity, where the outer edge has a lower etch rate than the rest of the workpiece. In these cases, all of the outer thermal zones 302-305 are maintained at a different temperature than the inner thermal zone 301. If etch rate is directly proportional to temperature, then outer thermal zones 302-305 are set to a higher temperature than the inner thermal zone 301. If etch rate is inversely proportional to temperature, then outer thermal zones 302-305 are set to a lower temperature than the inner thermal zone 301.

Figure 5E:
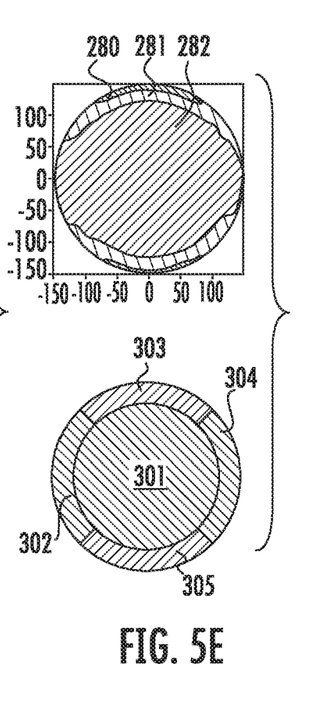

FIG. 5E shows an example where the top and bottom edges of the workpiece have a higher etch rate than the rest of the workpiece. Thus, if etch rate is directly proportional to temperature, then outer thermal zones 303, 305 are set to a lower temperature than the rest of the thermal zones. If etch rate is inversely proportional to temperature, then outer thermal zones 303, 305 are set to a higher temperature than the rest of the thermal zones.

Thus, the workpiece holder 300 of FIG. 4 may be used to compensate for both radial non-uniformity and linear non-uniformity.

Figure 6:
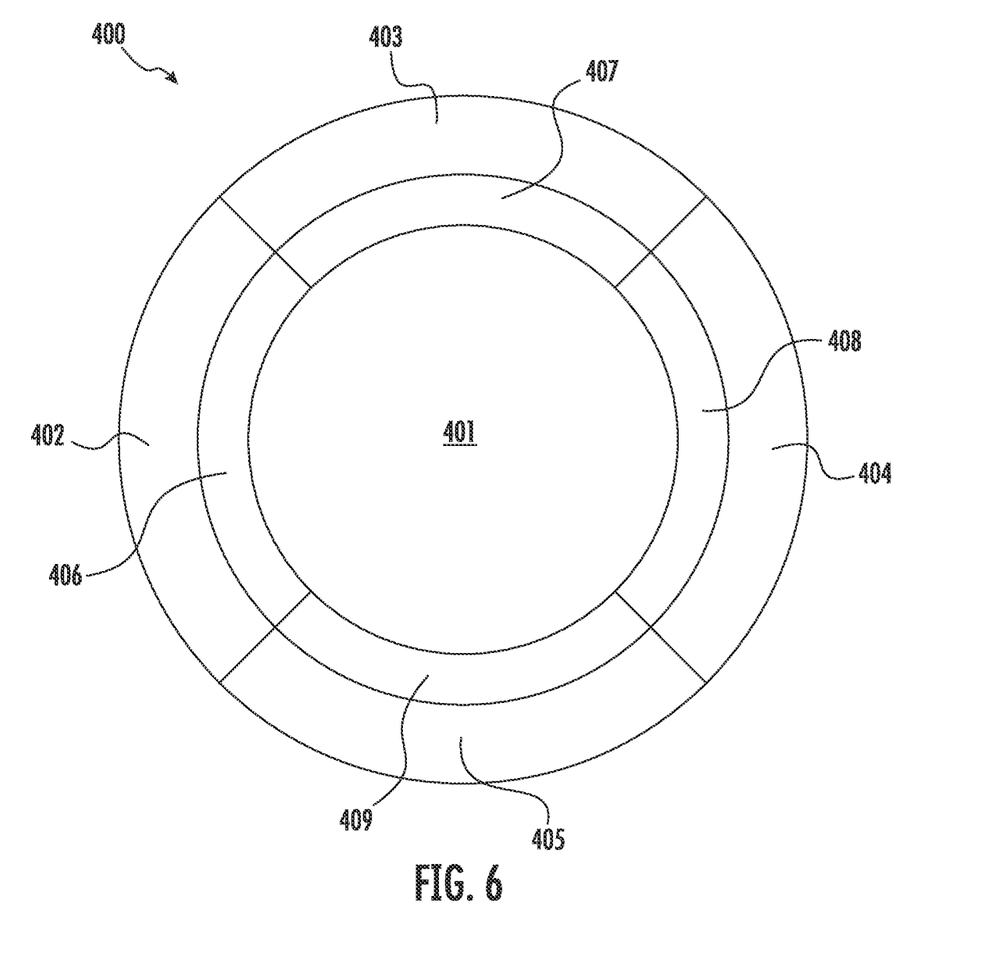
FIG. 6 is a second embodiment of a multi-zone heated workpiece holder.

Of course, other designs may be employed. FIG. 6 shows another workpiece holder 400, which includes an inner thermal zone 401, four outer thermal zones 402-405 and four intermediate thermal zones 406-409. This design may allow increased granularity, especially with respect to radial non-uniformity. In an alternative embodiment, the four intermediate thermal zones 406-409 are replaced with a single intermediate zone.

In other words, the workpiece holder may comprise an inner thermal zone, and one or more concentric rings surrounding the inner thermal zone, where one or more of those concentric rings is divided into a plurality of thermal zones. The number of concentric rings is not limited by this disclosure and may be any number greater than or equal to one. Similarly, the plurality of thermal zones that a concentric ring is divided into is not limited by this disclosure and may be any number greater than one. Further, the number of thermal zones in a particular concentric ring may be the same or different from the number of thermal zones in a different concentric ring. As described above, this configuration is effective for compensating for both radial and linear non-uniformities.

Figure 7:
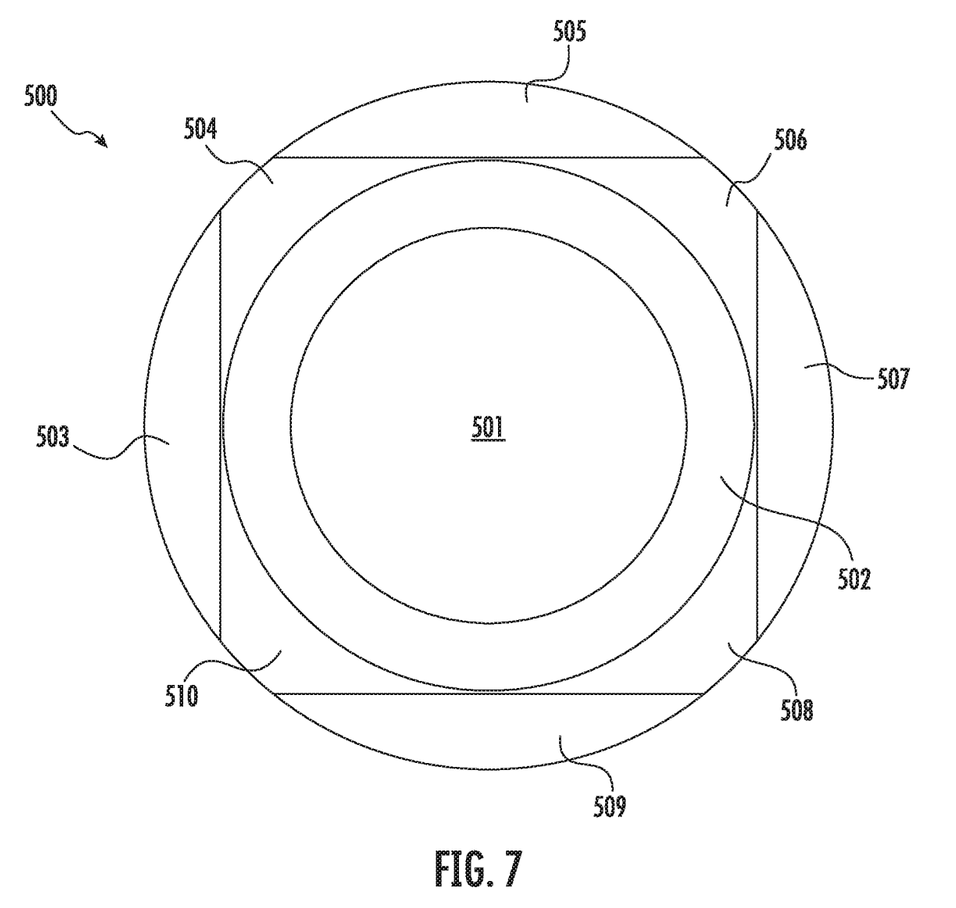
FIG. 7 is a third embodiment of a multi-zone heated workpiece holder.

FIG. 7 shows another design that can be used to compensate for both radial and linear non-uniformity. Like FIGS. 4 and 6, this workpiece holder 500 comprises an inner thermal zone and one or more concentric circles, where at least one of those concentric rings is divided into a plurality of thermal zones. In those embodiments, the boundaries of the thermal zones in the concentric ring were created using radial spokes. In this embodiment, the boundaries of the thermal zones in the outer concentric ring are created using horizontal and vertical segments. Thus, in this embodiment, there is an inner thermal zone and at least one concentric ring surrounding the inner thermal zone, where at least one of the concentric rings is divided using vertical and horizontal boundaries. Horizontal and vertical boundaries refer to boundaries that are perpendicular to one another, which touch and are tangent to a circular inner boundary at an intersecting point. Additionally, these boundaries are perpendicular to the radius that passes through the intersecting point. In the workpiece holder 500 of FIG. 7, there is an inner thermal zone 501, a first intermediate concentric thermal zone 502, and an outer concentric ring which is divided into eight outer thermal zones 503-510. Of course, the boundaries between the thermal zones in the outer concentric ring may not be vertical and horizontal. This illustration shows one possible implementation. The workpiece holder 500 of FIG. 7 may be used to compensate for both radial and linear non-uniformities. FIGS. 8A-8E show the five etch rate maps presented in FIGS. 3A-3E along with the corresponding thermal profiles of workpiece holder 500.

Figure 8A:
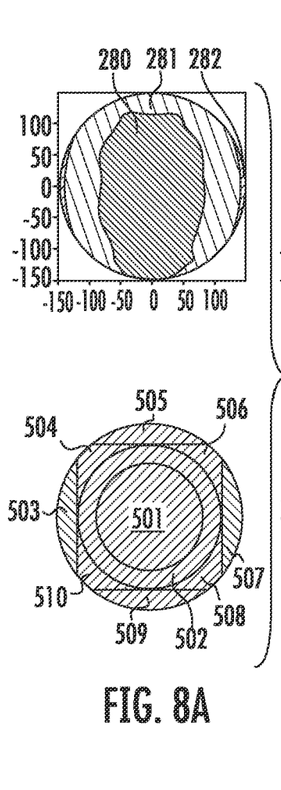
FIG. 8A-8E illustrate the heating patterns for the workpiece holder of FIG. 7 for the various etch rate maps.

This design offers more granularity than the previous designs. In FIG. 8A, if etch rate is directly proportional to temperature, then outer thermal zones 503, 507 are set to a higher temperature than the rest of the thermal zones. If etch rate is inversely proportional to temperature, then outer thermal zones 503, 507 are set to a lower temperature than the rest of the thermal zones.

Figure 8B:
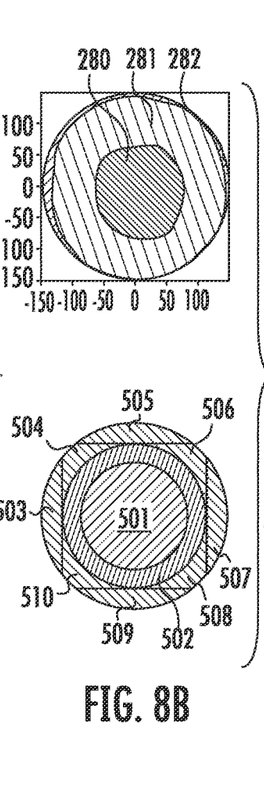

In FIG. 8B, if etch rate is directly proportional to temperature, then outer thermal zones 503-510 are set to a higher temperature than the rest of the thermal zones, while first intermediate concentric thermal zone 502 is set to a higher temperature than the inner thermal zone 501. If etch rate is inversely proportional to temperatures, then outer thermal zones 503-510 are set to a lower temperature than the rest of the thermal zones, while first intermediate concentric thermal zone 502 is set to a lower temperature than the inner thermal zone 501.

Figure 8C:
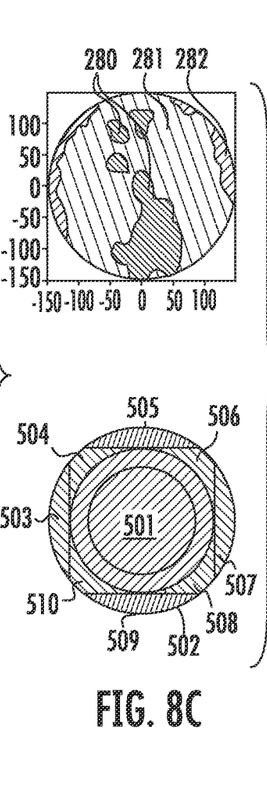
Figure 8D:
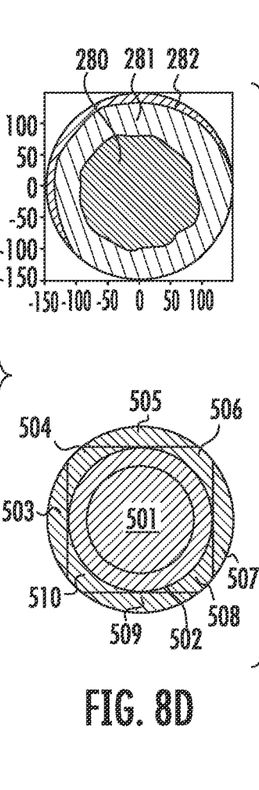

The pattern for FIG. 8D is similar to that for FIG. 8B, however, the first intermediate concentric thermal zone 502 may be maintained at the same temperature as the inner thermal zone 501.

In FIG. 8C, if etch rate is directly proportional to temperature, then outer thermal zones 503, 504, 506-508, 510 are set to a higher temperature than the rest of the thermal zones, while outer thermal zones 505, 509 are set to a higher temperature than the inner thermal zone 501. If etch rate is inversely proportional to temperatures, then outer thermal zones 503, 504, 506-508, 510 are set to a lower temperature than the rest of the thermal zones, while outer thermal zones 505, 509 are set to a lower temperature than the inner thermal zone 501.

Figure 8E:
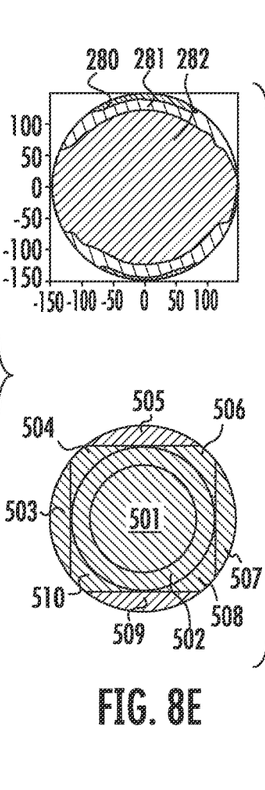

In FIG. 8E, if etch rate is directly proportional to temperature, then outer thermal zones 505, 509 are set to a lower temperature than the rest of the thermal zones. If etch rate is inversely proportional to temperatures, then outer thermal zones 505, 509 are set to a higher temperature than the rest of the thermal zones, while outer thermal zones 505, 509 are set to a lower temperature than the inner thermal zone 501.

Figure 9:
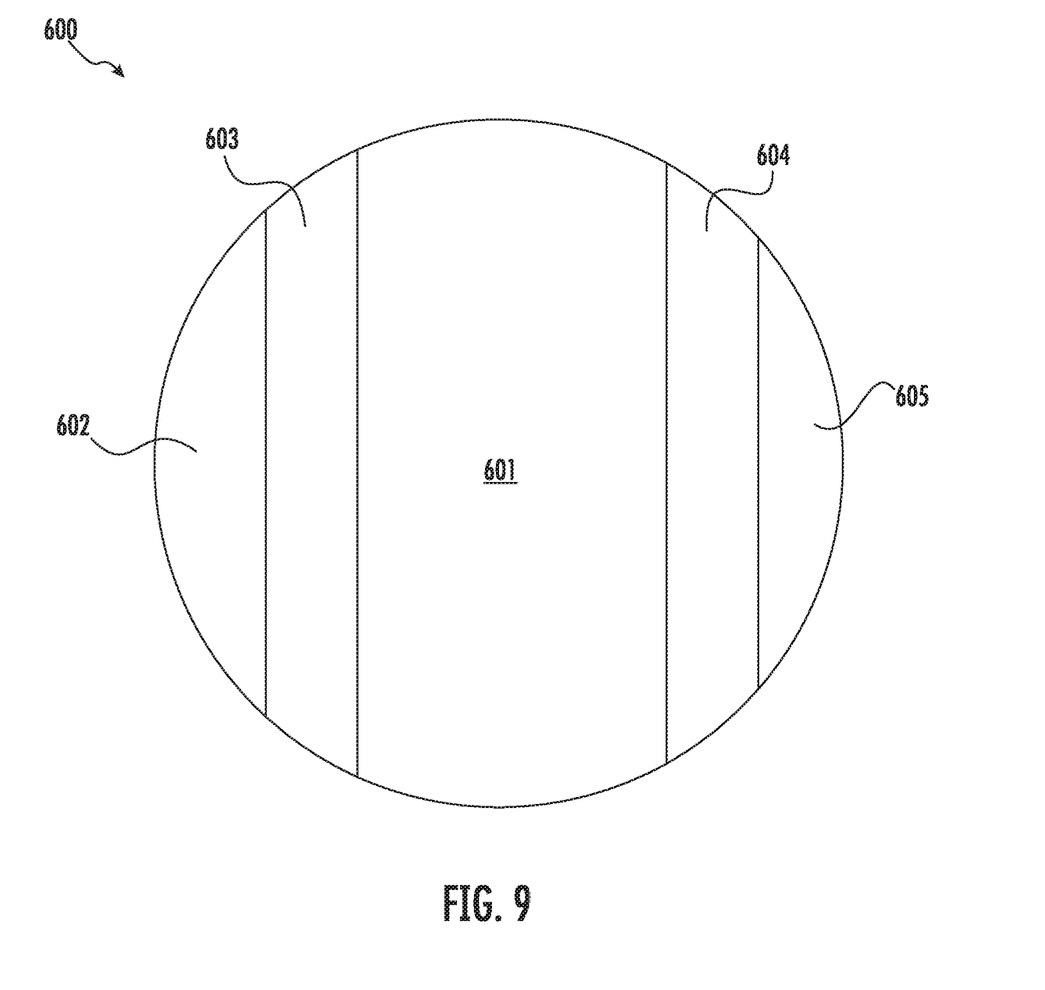
FIG. 9 is a fourth embodiment of a multi-zone heated workpiece holder.

While the above workpiece holders are designed to accommodate both radial and linear non-uniformities, other workpiece holders may be utilized to correct for only one type of non-uniformity. For example, FIG. 9 shows a workpiece holder 600 that may be used to correct for linear non-uniformities. In this embodiment, the workpiece holder 600 has a central thermal zone 601, and one or more vertical thermal zones disposed on opposite sides of the central thermal zone 601. In this embodiment, there are two vertical thermal zones on either side of the central thermal zone 601. Of course, there may be more or fewer vertical thermal zones. The outermost vertical thermal zones 602, 605 are positioned near the ends of the ribbon ion beam. The intermediate vertical thermal zones 603, 604 are positioned between the central thermal zone 601 and the outermost vertical thermal zones.

This workpiece holder 600 may be used to compensate for the etch rate maps shown in FIGS. 3A and 3C. Further, if the workpiece holder 600 is rotated one quarter turn, it may be used to compensate for the etch rate map shown in FIG. 3E. In this case, the workpiece holder comprises a central thermal zone, and one or more horizontal thermal zones disposed on opposite sides of the central thermal zone. Thus, FIG. 9 shows one example of a workpiece holder having thermal zones that may be used in a scanning system to compensate for linear non-uniformity of a ribbon ion beam.

Figure 10:
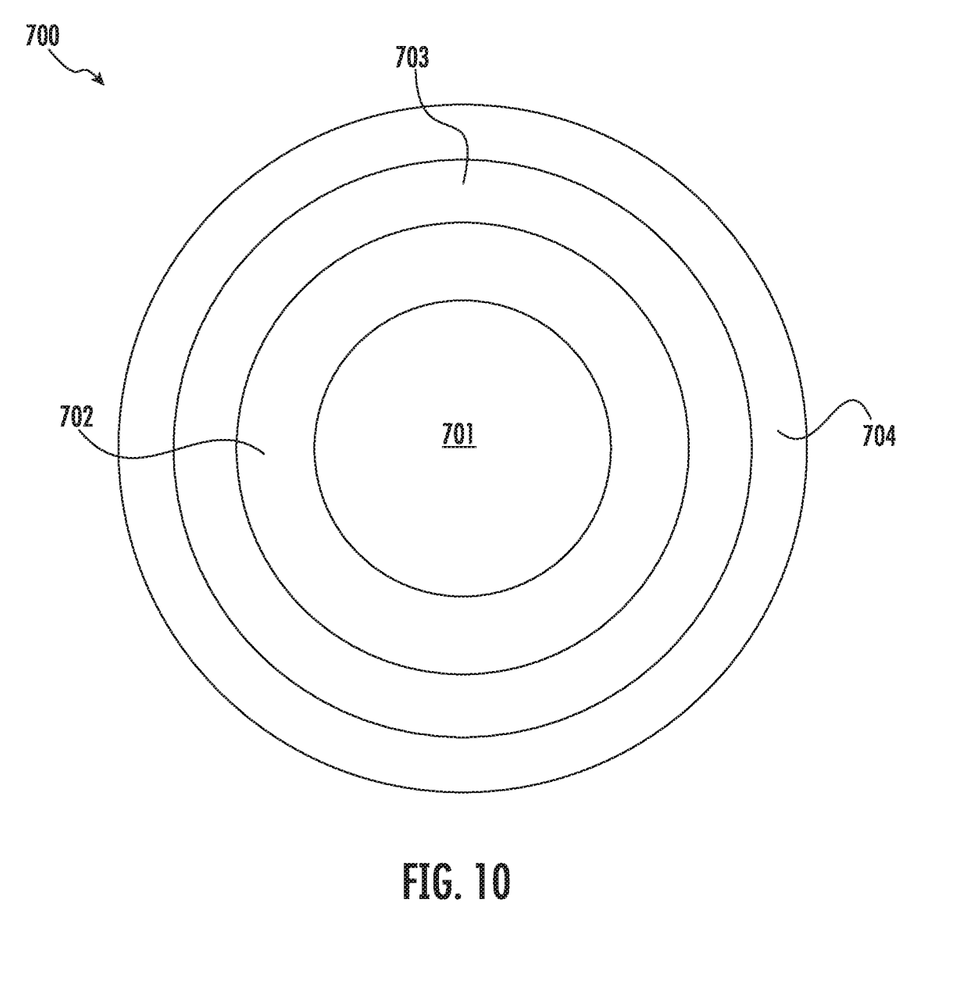
FIG. 10 is a fifth embodiment of a multi-zone heated workpiece holder.

FIG. 10 shows a workpiece holder 700 that may be used to compensate for radial non-uniformity. This workpiece holder 700 is similar to that shown in FIG. 4, however none of the concentric rings are divided into a plurality of thermal zones. In other words, there is an inner thermal zone 701 and a plurality of concentric thermal zones. Each concentric ring 702-704 represents a concentric thermal zone. This workpiece holder 700 may be used to compensate for the etch rate maps shown in FIGS. 3B and 3D.

The thermal controller 190 may be implemented in a number of ways. In one embodiment, each thermal zone in the workpiece holder has a corresponding dedicated power supply. In other embodiments, certain thermal zones may always be set to the same temperature. In these embodiments, a single power supply may be used to supply power to more than one thermal zone.

In another embodiment, thermal controller 190 may have one power supply for each power level. The outputs of these power supplies are used as the inputs to a plurality of switches or multiplexers, where each switch is used to select which output is applied to each thermal zone.

The embodiments described above in the present application may have many advantages. As noted above, certain processes utilize very tight tolerances for etch rate across the entire workpiece, such as a 3 sigma value of 3% or less. By manipulating the temperature of various regions of the workpiece, the etch rate associated with each region may be altered so as to achieve a more uniform result across the entire workpiece. For example, in one experiment, the etch non-uniformity exhibited a 3 sigma value of 6% using a uniform platen temperature as shown in FIG. 3A. By utilizing the multi-zone platen temperature control shown in FIG. 5A, the etch non-uniformity can be reduced, achieving a 3 sigma value of 3% or less. In other words, multi-zone platen temperature control may reduce the 3 sigma value of the etch non-uniformity by a factor of 2 or more, as compared to a uniform platen temperature.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An etching system, comprising:
   a semiconductor processing system to generate a ribbon ion beam;
   a workpiece holder, wherein the workpiece holder comprises a plurality of thermal zones to compensate for both radial and linear etch rate non-uniformities;
   a scanning motor to move the workpiece holder through the ribbon ion beam;
   and
   a thermal controller, comprising a plurality of power supplies in communication with the plurality of thermal zones and a controller in communication with the thermal controller, wherein a workpiece type and etching species are input to the controller and the thermal controller supplies power to the plurality of thermal zones to achieve a desired temperature profile.

2. The etching system of claim 1, wherein the workpiece holder comprises an inner thermal zone; and
   at least one concentric ring surrounding the inner thermal zone, wherein at least one of the at least one concentric ring is divided into a plurality of outer thermal zones.

3. The etching system of claim 2, wherein the inner thermal zone and the plurality of outer thermal zones may be independently controlled.

4. The etching system of claim 2, wherein a heating element is embedded in the inner thermal zone and each outer thermal zone.

5. The etching system of claim 2, wherein the at least one of the at least one concentric ring is divided using radial spokes.

6. The etching system of claim 5, wherein the plurality of outer thermal zones are equal sizes.

7. The etching system of claim 2, wherein the at least one of the at least one concentric ring is divided using horizontal and vertical boundaries.

8. The etching system of claim 1, wherein the workpiece holder comprises a central thermal zone and one or more horizontal thermal zones disposed on opposite sides of the central thermal zone.

9. An etching system, comprising:
   a semiconductor processing system to generate a ribbon ion beam;
   a workpiece holder, wherein the workpiece holder comprises a plurality of thermal zones to compensate for linear etch rate non-uniformities;
   a scanning motor to move the workpiece holder through the ribbon ion beam;
   and
   a thermal controller, comprising a plurality of power supplies in communication with the plurality of thermal zones and a controller in communication with the thermal controller, wherein a workpiece type and etching species are input to the controller and the thermal controller supplies power to the plurality of thermal zones to achieve a desired temperature profile.

10. The etching system of claim 9, wherein the workpiece holder comprises a central thermal zone, and one or more vertical thermal zones disposed on opposite sides of the central thermal zone.

11. The etching system of claim 10, wherein the central thermal zone and the one or more vertical thermal zones may be independently controlled.

12. The etching system of claim 10, wherein a heating element is embedded in the central thermal zone and each of the one or more vertical thermal zones.

13. An etching system, comprising:
    a semiconductor processing system to generate a ribbon ion beam;
    a workpiece holder, wherein the workpiece holder comprises a plurality of thermal zones to compensate for both radial and linear etch rate non-uniformities; and
    a scanning motor to move the workpiece holder through the ribbon ion beam,
    wherein the workpiece holder comprises an inner thermal zone; and at least one concentric ring surrounding the inner thermal zone, wherein at least one of the at least one concentric ring is divided into a plurality of outer thermal zones; and wherein the at least one of the at least one concentric ring is divided using horizontal and vertical boundaries.

* * * * *

UNITED STATES PATENT AND TRADEMARK OFFICE
CERTIFICATE OF CORRECTION

| | | |
|---|---|---|
| PATENT NO. | : 11,646,213 B2 | Page 1 of 1 |
| APPLICATION NO. | : 16/865860 | |
| DATED | : May 9, 2023 | |
| INVENTOR(S) | : Anglin et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 246 days.

Signed and Sealed this
Thirty-first Day of December, 2024

Derrick Brent
*Acting Director of the United States Patent and Trademark Office*